United States Patent [19]
Lanigan et al.

[11] 3,975,756
[45] Aug. 17, 1976

[54] GADOLINIUM DOPED GERMANIUM

[75] Inventors: Daniel J. Lanigan, Herndon, Va.;
Marvin M. Cohen, Rockville, Md.

[73] Assignee: The United States of America as represented by the Secretary of the Army, Washington, D.C.

[22] Filed: June 28, 1974

[21] Appl. No.: 484,038

[52] U.S. Cl. ............................... 357/63; 148/185; 148/190; 357/61; 357/64; 357/67
[51] Int. Cl.² ........................................ H01L 29/167
[58] Field of Search ........................ 357/63, 64, 67; 148/185, 190

[56] References Cited
UNITED STATES PATENTS

| | | | |
|---|---|---|---|
| 3,311,510 | 3/1967 | Mandelkorn | 357/63 |
| 3,355,638 | 11/1967 | Gaudlitz | 357/63 |
| 3,662,232 | 5/1972 | Stahr | 357/63 |

OTHER PUBLICATIONS

Sze, Physics of Semiconductor Devices, Wiley–Interscience, N.Y., 1969, p. 30.

*Primary Examiner*—William D. Larkins
*Attorney, Agent, or Firm*—Nathan Edelberg; Robert P. Gibson; Saul Elbaum

[57] ABSTRACT

A new light-sensitive, current limiting solid state diode is formed by using gadolinium as a dopant in a germanium crystal to which a gold-germanium eutectic is alloyed thereto, in order to form a p-n junction.

6 Claims, 4 Drawing Figures

Gd DOPED Ge DIODE

GADOLINIUM DOPED GERMANIUM

RIGHTS OF THE GOVERNMENT

The invention described herein may be manufactured, used and licensed by or for the United States government for governmental purposes without payment to us of any royalty thereon.

BACKGROUND OF THE INVENTION

The present invention relates to semi-conductor device making wherein said semi-conductor device possesses improved properties as a light sensitive resistance and control device.

This invention also relates to a p-n semi-conductor device having improved properties as a light sensitive control device.

More particularly, this invention relates to a semi-conductor light sensitive device having improved properties by the use of a germanium crystalline material having a small quantity of gadolinium impurity diffused into said Ge material.

OBJECTS OF THE INVENTION

A significant object of this invention is to provide a suitable semi-conductor light sensitive device that will be useful not only in the visible and ultra-violet regions, but also in the infra-red regions.

Another object of this invention is to provide an n-type material having improved characteristics for making semi-conductor light sensitive devices.

A further object is to provide an improved light sensitive device of germanium containing a controlled amount of gadolinium as an impurity.

Other objects and advantages of this invention will be better understood by reference to the following detailed description when considered with the accompanying drawings wherein.

DETAILED DESCRIPTION OF THE INVENTION

The present invention is based on the discovery that gadolinium affects the formation of recombination centers in germanium. It has also been discovered that when gadolinium is employed as a dopant for germanium rather than those conventionally used, e.g., boron, the gadolinium results in the formation of either less recombination centers or less trapping centers.

According to the present invention, effective amounts of gadolinium are added to germanium to reduce its resistivity and serve as a more efficient light sensitive semi-conductor device. For example, gadolinium is added to germanium and then a gold-germanium eutectic is added thereto in order to form a p-n junction that evidences a light sensitivity in the visible and ultra-violet regions as well as in the infra-red region of the spectrum.

The technique of this invention used to make an effective semi-conductor light sensitive device is different from, and an improvement over, techniques previously used. The starting material is a single crystal of germanium doped with gadolinium in an amount effective to impart a substantially current limiting behavior in the forward bias region. More specifically, the amount of gadolinium used as a dopant is at least about $10^{13}$ atoms cm$^{-3}$ with best results being achieved at $10^{15}$ atoms cm$^{-3}$. This resultant material is n-type. A p-n junction is then formed by alloying, diffusion, ion-implantation or any other extant technique. It is crucial that the p-type region be formed with gold as the dopant because it is believed that the interaction between the gold and the gadolinium gives the light sensitive diode its unique properties. When alloying is used to form the p-n junction, a piece of Au-Ge eutectic is alloyed to the surface of the gadolinium doped germanium for about 4 seconds at approximately 650°C. The configuration of the diode is shown in FIG. 1.

Figure 1:
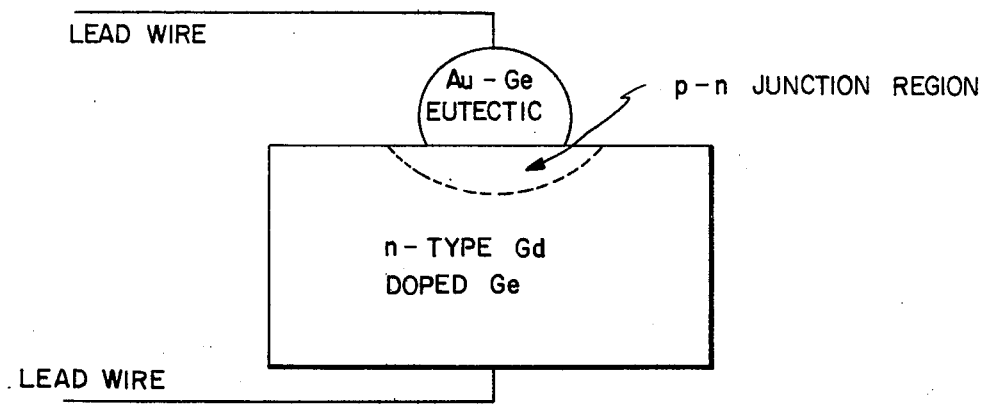
FIG. 1 shows a cross-section of a gadolinium doped germanium diode light valve produced by the method of this invention.
Figure 2:
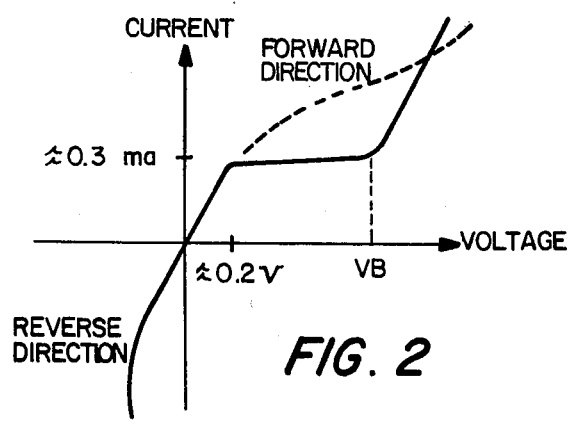
FIG. 2 shows a diagram giving the typical current-voltage characteristics of a gadolinium doped germanium diode device.
Figure 3:
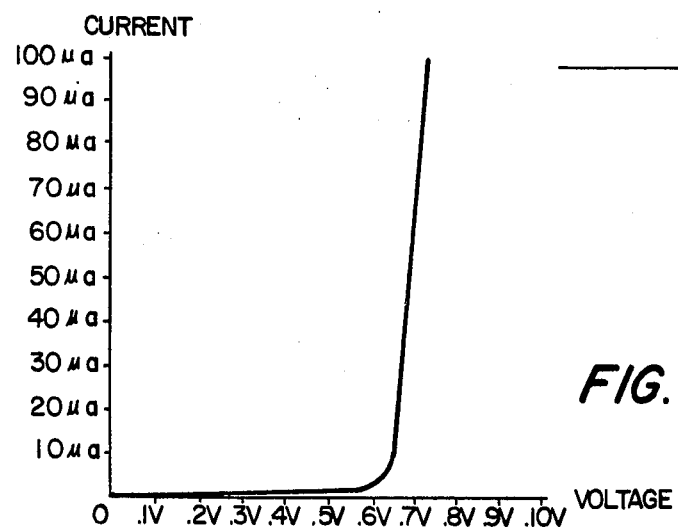
FIG. 3 shows a comparison diagram giving the typical current-voltage characteristics for a silicon crystal wherein the n-side is doped with boron and the p-side is doped with phosphorus.

With the fabrication process described above, using gadolinium as the dopant, the resultant device of FIG. 1 typically exhibits the current-voltage characteristic shown in FIG. 2 as compared to a conventional p-n junction device current-voltage characteristic. (FIG. 3) The solid curve in the forward bias region of FIG. 2 shows how the current is limited to about 0.3 ma for applied voltages in the range from about 0.2V to $V_B$, the breakdown voltage (typically 1.5 V). Thus, the diode may be used as a current limiter in this range. The flatness of the curve in this range is a function of alloying time and temperature and is thought to be dependent upon the gadolinium concentration. For longer alloying cycles and higher alloying temperatures, the forward bias part of the current-voltage curve will typically follow the dashed line shown in FIG. 2.

Although the reverse bias region of the current-voltage curve has been found to be virtually insensitive to changes in the diode, the "saturation" current in the forward bias region increases with increasing intensity of incident light. This behavior is illustrated in FIG. 4, wherein curve A represents ambient lighting and curves B and C represent low and high intensity illumination, respectively, by a microscope lamp.

Figure 4:
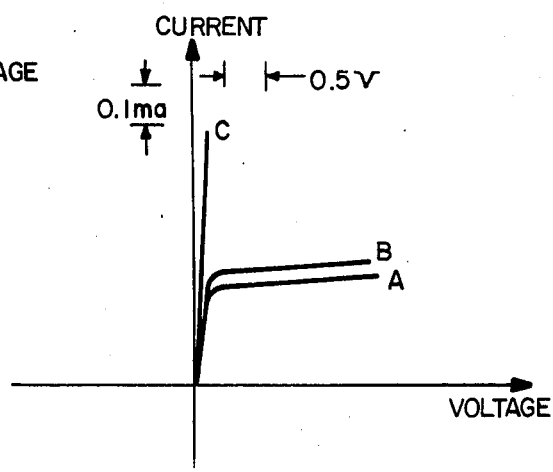
FIG. 4 shows a diagram giving typical current-voltage characteristics for various lighting conditions for a gadolinium doped germanium diode device.

This forward bias behavior illustrated in FIG. 4 indicates two possible applications for the gadolinium doped germanium device; namely, a light sensitive resistor and a light sensitive control device.

For use as a light sensitive resistor, the device would be forward biased with a voltage between 0 volts and that at which current saturation occurs (the knee in curve A of FIG. 4 — to typically 200 mv). In this case, the resistance of the device decreases as the incident light intensity increases. When used as a light sensitive semi-conducting diode control device, the diode would be forward biased in the saturation region. The change in "saturation" current resulting from a change in incident light intensity can then be used as a control signal. At present, it is believed that light sensitivity of this diode is greater in the infra-red than in the visible or ultra-violet regions of the spectrum.

We wish it to be understood that we do not desire to be limited to the exact details of construction shown and described, for obvious modifications can be made by a person skilled in the art. Accordingly

What is claimed is:

1. A method of forming an improved light-sensitive semi-conductor device comprising alloying a gold-germanium eutectic on the surface of a single gadolinium doped germanium crystal thereby forming a p-n junction.

2. The method of claim 1 which comprises alloying said gold-germanium eutectic on the surface of said doped crystal for about 4 seconds at about 650°C.

3. An improved light-sensitive semi-conductor comprising an alloyed gold-germanium eutectic on the surface of a single crystal of germanium doped with gadolinium thereby forming a p-n junction.

4. The semi-conductor of claim 3 containing an amount of gadolinium effective to impart a substantially constant current-limiting behavior in the forward bias region of said crystal.

5. The semi-conductor of claim 4, wherein the impurity concentration of said gadolinium in said germanium is at least about $10^{13}$ atoms $cm^{-3}$.

6. The semi-conductor of claim 4, wherein the impurity concentration of said gadolinium in said germanium is about $10^{15}$ atoms $cm^{-3}$.

* * * * *